United States Patent [19]
Mizumoto et al.

[11] Patent Number: 5,956,843
[45] Date of Patent: Sep. 28, 1999

[54] MULTILAYER PRINTED WIRING BOARD AND METHOD OF MAKING SAME

[75] Inventors: Shogo Mizumoto, Ohtsu; Yutaka Tsukada, Shiga, both of Japan

[73] Assignee: International Business Machines, Armonk, N.Y.

[21] Appl. No.: 08/795,182

[22] Filed: Feb. 4, 1997

Related U.S. Application Data

[62] Division of application No. 08/595,063, Feb. 1, 1996, Pat. No. 5,662,987.

[30] Foreign Application Priority Data

Feb. 17, 1995 [JP] Japan ................................. 7-029704

[51] Int. Cl.⁶ .............................. H05K 3/40; H05K 3/42; H05K 3/46; H05K 3/38
[52] U.S. Cl. ................................ 29/852; 29/830; 29/831; 29/847; 29/853; 174/257; 174/258; 174/259; 174/264; 427/97
[58] Field of Search ........................... 29/830, 831, 852, 29/853, 847; 174/257, 258, 259, 262, 264; 427/96, 97; 428/901

[56] References Cited

U.S. PATENT DOCUMENTS

| | | |
|---|---|---|
| 3,471,631 | 10/1969 | Quintana . |
| 4,908,940 | 3/1990 | Amano et al. ............................. 29/852 |
| 5,042,148 | 8/1991 | Tada et al. ............................... 29/852 |
| 5,108,785 | 4/1992 | Lincoln et al. ........................... 427/96 |
| 5,231,751 | 8/1993 | Sachdev et al. ......................... 29/852 |
| 5,323,520 | 6/1994 | Petero et al. ......................... 29/852 X |
| 5,699,613 | 12/1997 | Chong et al. ............................. 29/852 |

FOREIGN PATENT DOCUMENTS

| | | |
|---|---|---|
| 0 572 232 A2 | 5/1993 | European Pat. Off. . |
| 04091489 | 3/1992 | Japan . |
| 05275857 | 10/1993 | Japan . |
| 6164152 | 6/1994 | Japan ..................................... 29/852 |
| 07038218 | 2/1995 | Japan . |
| 07079078 | 3/1995 | Japan . |
| 1145771 | 4/1966 | United Kingdom . |
| 2 203 290 | 2/1988 | United Kingdom . |

Primary Examiner—Peter Vo
Attorney, Agent, or Firm—Lawrence R. Fraley

[57] ABSTRACT

A multilayered printed wiring board includes two or more layers each having a via hole therein, these holes aligned vertically above one another to minimize board real estate while assuring an effective circuit path between respective points on the two layers. One or both via holes can be filled with either an electrically conductive material (e.g., copper paste) or a nonconductive material (e.g., resin).

4 Claims, 9 Drawing Sheets

MULTILAYER PRINTED WIRING BOARD AND METHOD OF MAKING SAME

This is a divisional of application Ser. No. 08/595,063 filed on Feb. 1, 1996. This application is now U.S. Pat. No. 5,662,987.

TECHNICAL FIELD

The present invention relates to multilayer printed circuit (wiring) board structures, and more particularly to such a structure and method for making same wherein electrical connection between non-adjacent layers in the multilayer printed wiring board is possible by means of a via hole.

BACKGROUND OF THE INVENTION

A multilayer printed wiring board is a printed wiring board comprising a plurality of conductive wiring layers with interim dielectric layers. By installing lands for connection on the wiring layers, forming a through-hole penetrating all of the board's wiring and dielectric layers and coating this through-hole with conductive material, e.g., copper, a method for electrically connecting separate conductive wiring layers using the through-hole is possible. A through-hole is thus understood to pass through the board's entire thickness.

In addition, a conductive via hole can also be used as a means for electrically connecting selected adjacent layers. A via hole is typically a small hole provided in a dielectric layer, having an interior surface plated with conductive material, and which serves to electrically connect upper and lower conductive layers on opposite sides of the dielectric. A via hole is thus understood to comprise an internally positioned conductive hole within the final board structure, as opposed to a through-hole which passes entirely through the board. For forming a via hole, a buildup method is typically employed. As shown in FIGS. 1 to 4, such a method typically involves the building up of a plurality of individual layers by repeating the process of forming a singular insulating resin layer. Via holes may then be provided along with various conductive layers to form a sub-composite which is then laminated together with other laminates in a defined pattern of alignment. To take an example, as shown in FIG. 1, a photosensitive insulating (dielectric) resin film 110 is applied on a substrate 100 having connecting land 105. This application may be performed by spin coating, screen printing, curtain coating or the like methods. As shown in FIG. 2, a via hole 130 is formed in dielectric 110 above on the land 105 by performing a known photolithographic method typically involving exposure, development, and etching steps to provide, typically, a predetermined pattern of such holes in the photosensitive insulating resin layer. The etching step may be performed using known dry and/or wet methodology. Then, as shown in FIG. 3, a conductive layer 140 is formed (e.g. plated) with conductive material on the via hole 130. Furthermore, as shown in FIG. 4, a second insulating resin layer 150 can now be added to obtain a double insulative layered subassembly. Since only holes formed internally at required places are deemed sufficient, this buildup method is excellent in that the degree of freedom for wiring is so much the greater compared to the through-hole version involving total board penetration.

In the aforedefined buildup method, where it is desired to electrically connect spaced apart points A and B, (e.g., on dielectric layers 110 and 180 as shown in FIG. 5), a second via hole 160 is typically formed on the third (interim) insulating layer 150. Hole 160 is situated slightly offset from a position directly above the first via hole 130 formed in first insulating layer 110. The illustrated via hole 190 is similarly formed on the respective insulating layer 180 a slight distance apart from the interconnecting via hole 160 in insulating layer 150. Accordingly, a via hole has been formed not directly above another via hole to electrically connect two non-adjacent layers (e.g., 180 and 110).

In a structure such as shown in FIG. 5, however, a total area proportional to nearly a square of $d_1$ is required for electrically connecting points A and B through such a via hole as 160. $d_1$ is understood to be the dimension of the maximum distance between the respective outermost internal sidewalls of holes 130 and 160. Understandably, $d_1$ becomes relatively large because of the oblique positioning orientation between holes 130 and 160. Such a connection (by forming the next via hole obliquely above a first via hole), does not satisfy today's demands for higher circuit densities.

It has been considered for ensuring such demand to form two via holes directly above one another, for example, as shown in FIG. 6. In FIG. 6, a first via hole 130 is formed on a first insulating layer 110 and a second via hole 160 is formed right above this first via hole within the second insulating layer 150. Then, a plated layer 170 is formed on the second via hole 160 to thereby provide connection between a point A on the second insulating layer 150 (where, most likely, additional circuitry will also be located) and a point B on the lower substrate 100. There are various problems associated with the FIG. 6 approach, as described in greater detail hereinbelow.

Firstly, the second insulating layer 150 is typically etched by a wet process (or the like) in forming the via hole 160. This etching process takes considerable time due primarily to the need for etching about twice the normal depth. When performing such a relatively long duration etching, etching occurs not only in the depth (vertical) direction but also in a substantially radial direction. Thus the diameter ($d_2$) of the resulting hole has a tendency to become relatively large, another unacceptable feature. As with the example in FIG. 5, a total area for connecting point A and B can be estimated to be approximately the square of $d_2$.

A second problem associated with the FIG. 6 approach is that the etching procedure might not always be completely performed. If incomplete, the second insulating layer 150 may not be entirely etched out such that some of its material (172) remains on the bottom of the lower via hole 130. An excessive amount of such material 172, being dielectric, may adversely affect a desired connection between the plated layer 140 formed on the first via hole 130 and a plated layer 170 formed on the second via hole.

Thus, simply forming another via hole directly over a lower via hole may not meet the stringent requirements of reduced overall board area consumption and increased operational reliability.

As a structure for electrically connecting two non-adjacent layers, consideration has also been given to using no via hole(s). For example, use of a post (called stud) composed of conductive materials has been considered. The process of doing so is illustrated in FIGS. 7–11. Firstly, after applying a photoresist (210) or the like on a substrate 200 and forming an opening (or openings) in the resist, metal or other conductive materials 220 is deposited in the opening (e.g., using a technique such as plating). Thereafter, as shown in FIG. 8, the resist is removed using known techniques to thereby leave only the stud (220) atop the substrate. Then, as shown in FIG. 9, an insulating resin layer 230 is provided in such a manner as to completely cover stud (220) and the remaining exposed surface of the substrate. The resin's upper surface and part of the stud (220) are then smoothed to provide the configuration depicted in FIG. 10. Repeating this process, a structure for electrically connecting two points A and B (FIG. 11) can be obtained. This method, not utilizing etching, only has a small consumed area (proportional to a square of $d_3$) in the structure required for electrically connecting points A and B. Greater densities are thus possible compared to the foregoing other procedures. However, this method also has disadvantages. Firstly, because the insulating layer 230 is applied without supporting the stud, collapse of the stud is possible. Collapse of the stud (220) in turn may cause an electrical disconnection to occur at that position, thereby bringing about adverse effects such as improper operation of a finished product having this structure as part thereof. In such an embodiment as shown in FIG. 10, it is difficult to secure the layer material 230 to stud (220) to form a strong bond between the two (along interface A). Reduced joining strength may result, e.g., due to a slight amount of impurities (such as dust) mixed into the interface, thereby causing the interface to be separated and a gap to appear. Corrosion may then occur, which can then of course adversely affect the resulting product's reliability.

It is believed, therefore, that a printed wiring board made in accordance with procedures which obviate those adverse features cited hereinabove, would constitute a significant advancement in the art. It is further believed that such a procedure would also represent an art advancement.

DISCLOSURE OF THE INVENTION

Considering the above problems, the present invention possesses the following objects:

(1) To provide a structure for electrically connecting two layers or more in a multilayer printed wiring board and more particularly for effectively electrically connecting two points through at least one layer;

(2) To provide a structure wherein such a connection consumes a relatively small area, thereby enabling a product with high density wiring; and (3) To provide a highly reliable method of making such a product.

In accordance with one embodiment of the invention, there is provided a multilayered printed wiring board which comprises a first insulating layer having a first via hole filled with a filler material, and a second insulating layer formed above and in contact with the first insulating layer and having a second via hole located right above the first via hole.

In accordance with another embodiment of the invention, there is provided a method for fabricating a multilayered printed wiring board comprising the steps of providing an insulating layer, forming a via hole at a predetermined position within the insulating layer, forming a metal plated layer on the via hole, filling the via hole with filler material, smoothing the surface of the printed wiring board after the step of filling, and forming an electrical circuit pattern from the metal plated layer.

BEST MODE FOR CARRYING OUT THE INVENTION

For a better understanding of the present invention, together with other objects, advantages and capabilities thereof, reference is made to the following disclosure in combination with the above-described drawings.

As understood from the following, a multilayered printed wiring board according to the present invention will comprise a first insulating layer having a via hole therein and filled with conductive material filler, and a second insulating layer formed in contact with the first insulating layer wherein a second via hole formed in the second insulating layer is situated directly above (and thus in line with) the via hole formed in the first insulating layer.

Also, the via hole formed in the second insulating layer may be filled with conductive filler material. This material is preferably metal material but may be metal paste or resin. Especially desirable for this filler is copper, particularly if the conductive material for the board's circuitry is also copper, thereby assuring material compatibility.

In such a structure (FIG. 12), a first point (point A) on the second insulating layer (320) and a second point (point B) in the first insulating layer (310) is electrically connected through a plated layer on the via hole (350) formed in the first insulating layer and a plated layer on the via hole (340), in the second insulating layer, using a minimum of circuit board real estate.

Figure 1:
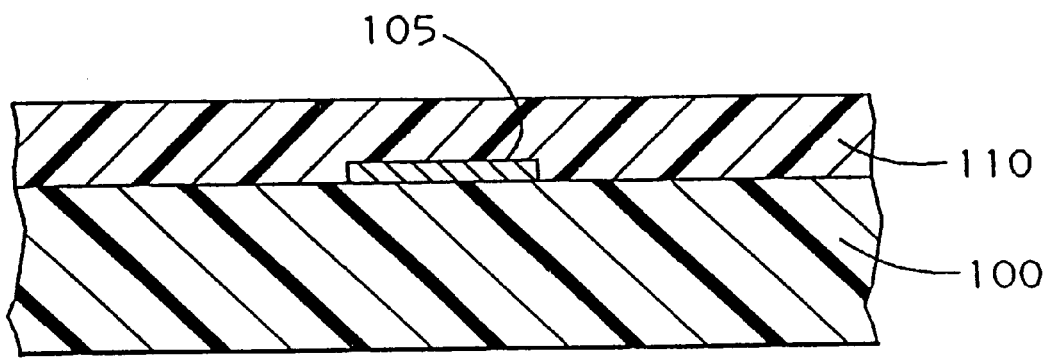
FIGS. 1–6, as mentioned above, represent views of various steps of making a board structure using processes known in the prior art.
Figure 2:
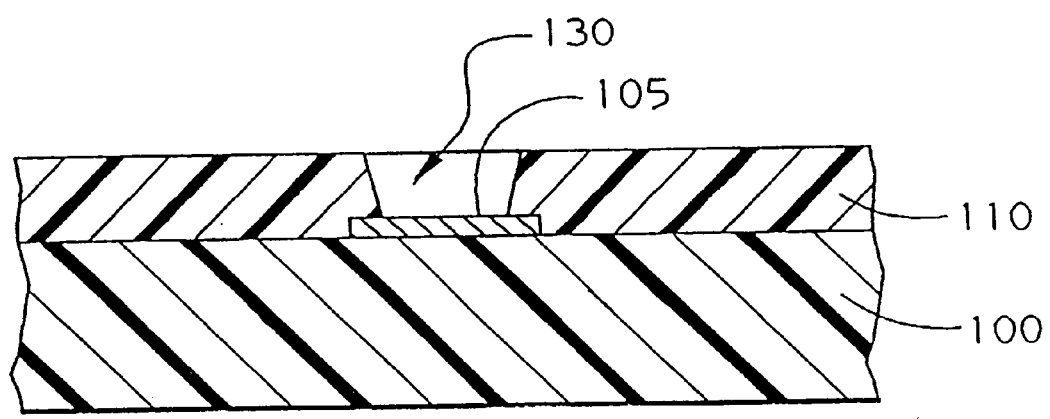
Figure 3:
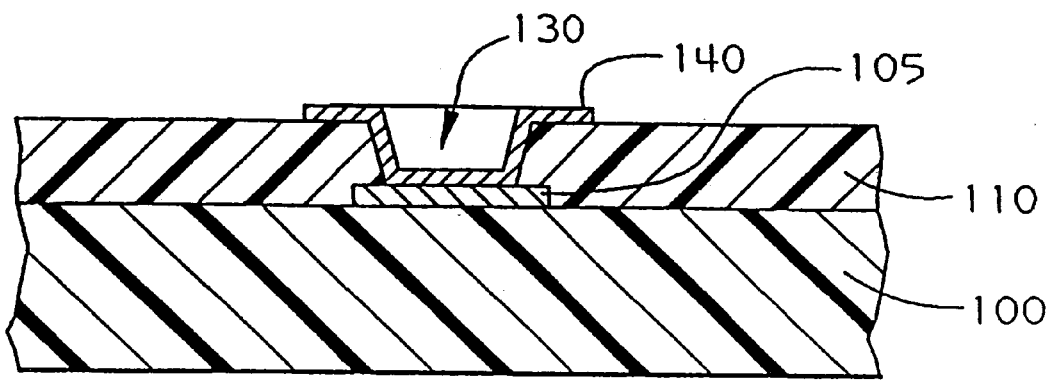
Figure 4:
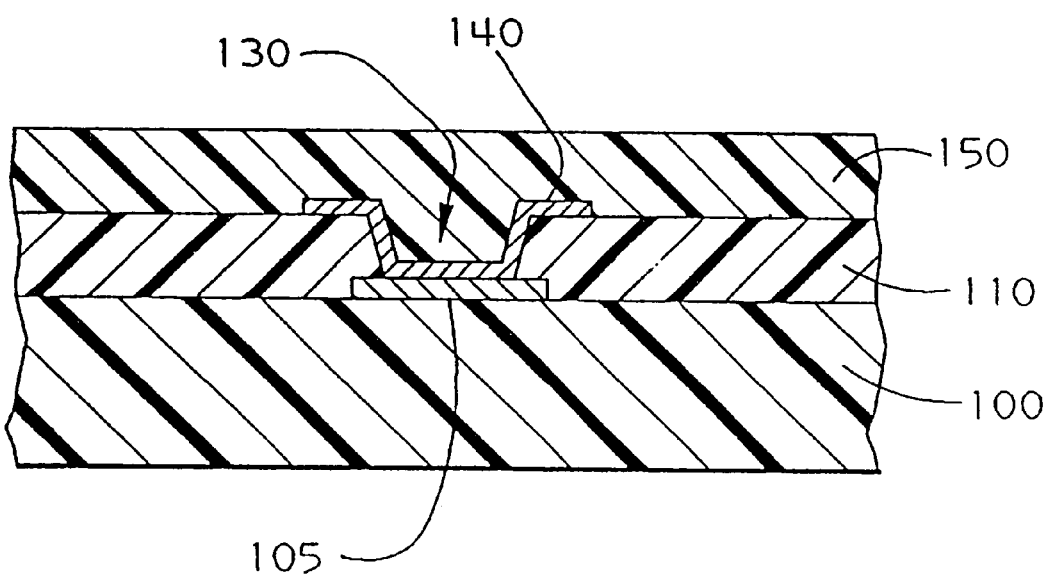
Figure 5:
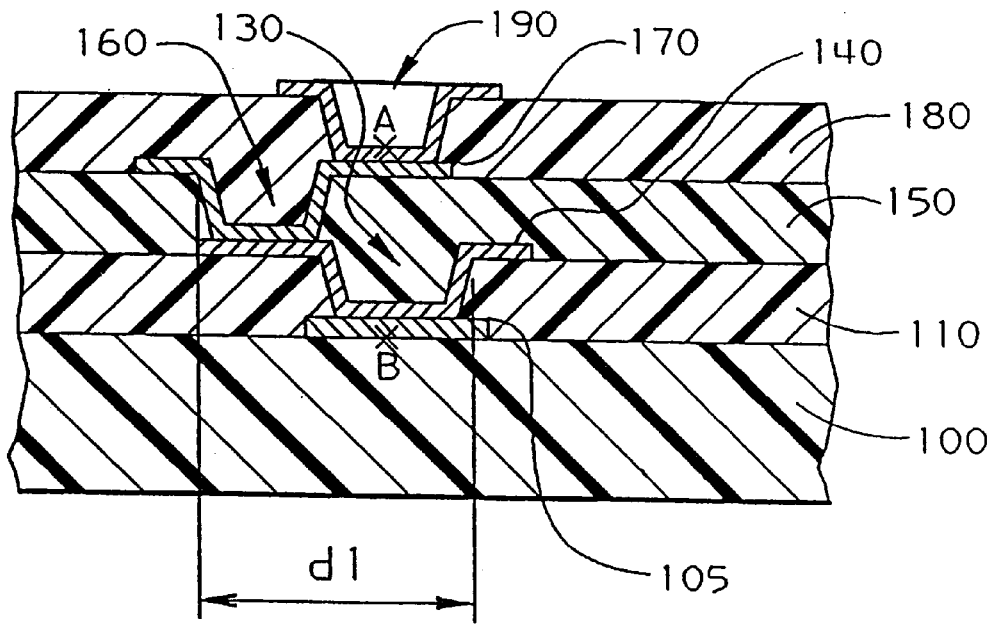
Figure 6:
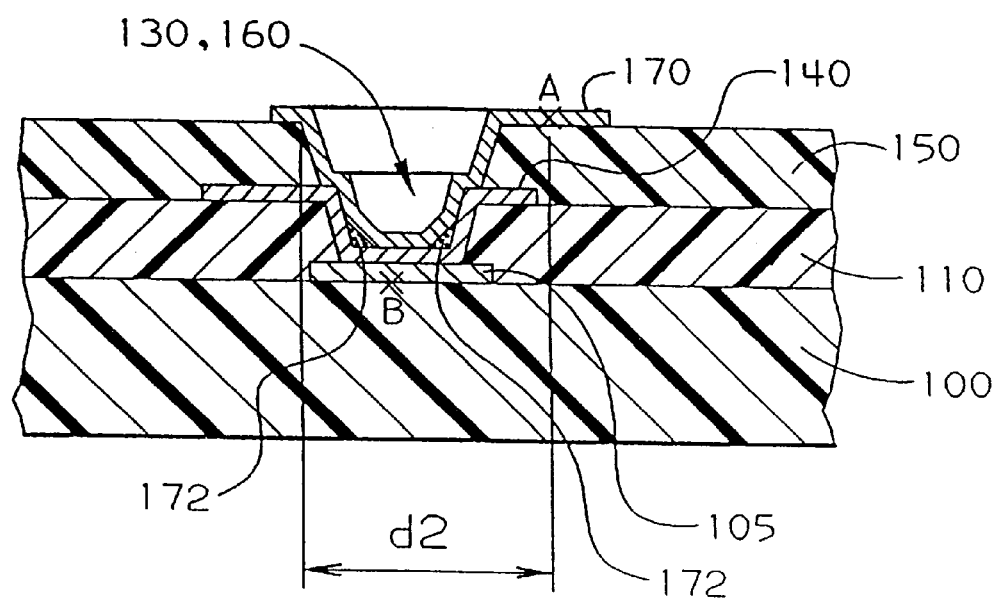
Figure 7:
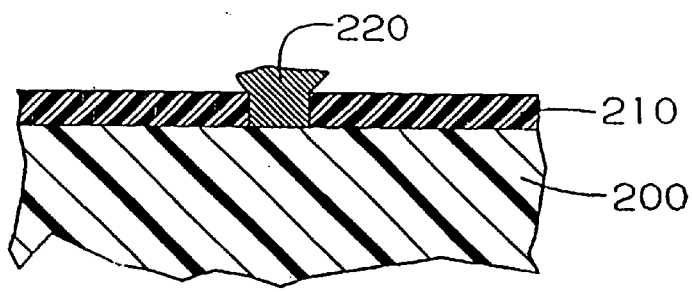
FIGS. 7–11 illustrate various views of steps of another known prior art method for making a board structure wherein stud formation is utilized.
Figure 8:
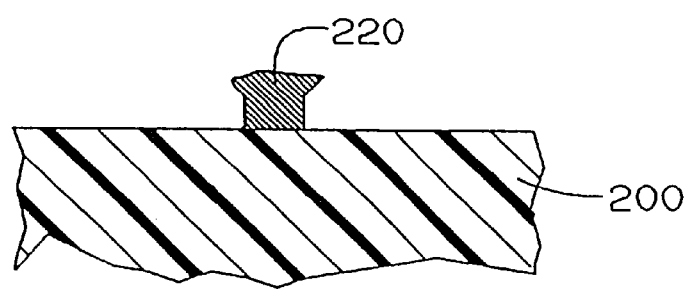
Figure 9:
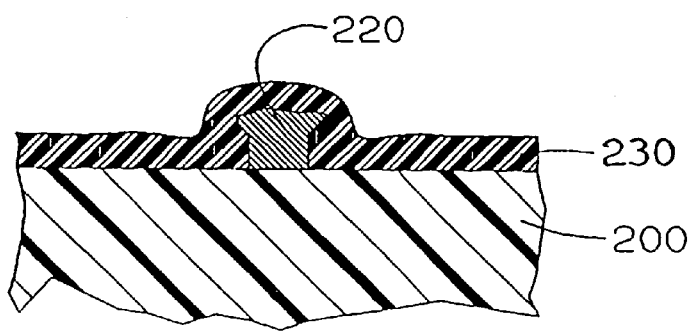
Figure 10:
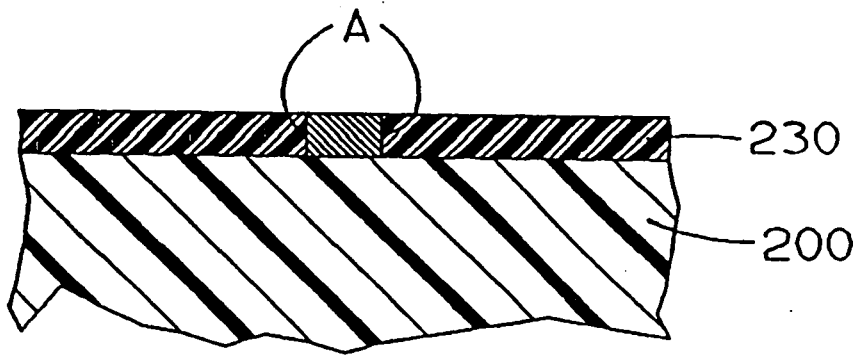
Figure 12:
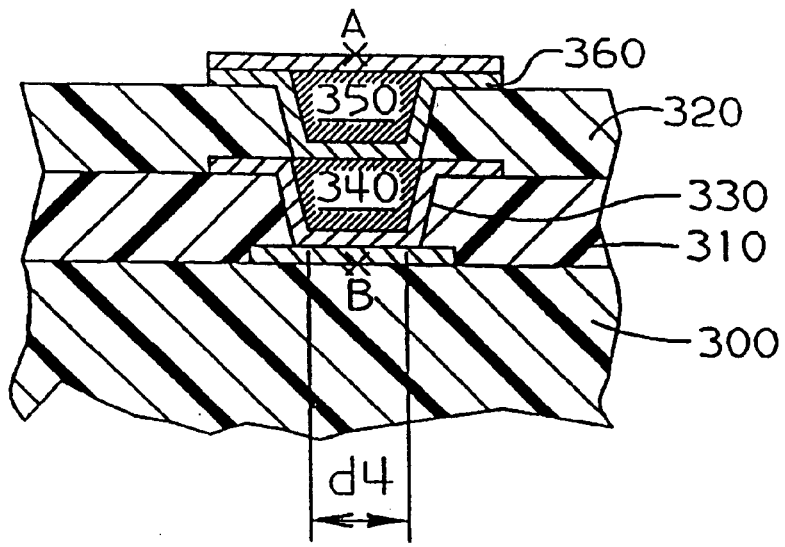
FIGS. 12 and 13 represent partial, sectional views of a multilayered wiring board including interconnection via holes produced in accordance with one embodiment of the present invention.

As stated, FIG. 12 represents one embodiment of the present invention. This is a structure in which a plated layer 330 made of a conductive material is provided on a first via hole formed in the first insulating layer 310 on the substrate 300, the first via hole 340 being filled with metal, metal paste or the like electrically conductive material. As described below, even a non-conductive filler material is possible. This filled structure has a smoothed surface, on which a second insulating layer 320 can be formed. Formed on the second insulating layer 320 is a second via hole 350 having a plated layer 360 on it, where the second via hole 350 is formed substantially directly above the filled first via hole 340. As a result, the area needed for electrically connecting points A and B is approximately a square of the diameter ($d_4$) of the via hole (340), and therefore much less than the area consumed in the prior art method shown in FIGS. 5 and 6.

If the via holes are oriented in the stacked arrangement as shown, the consumed board area can be minimized not only when electrically connecting two points with one layer sandwiched therebetween but also when electrically connecting two points with two layers or more sandwiched therebetween. This is accomplished by merely stacking a desired number of such filled via holes in such a vertical orientation as shown herein.

The described conductive filler material is preferably a metal. In particular, the same metal as the invention's plated layer is preferred from the standpoint of assuring compatibility, thereby substantially preventing corrosion. Copper is most preferred. The reason such similar material is preferred is to position similar conductive materials between the points being connected, thereby assuring a fixed line of connection with materials of known conductibility (and resistance). This should serve to avoid use of other layers as part of the board's structure. For example, using a copper conductive material as the filler material between copper plated layers in FIG. 12, the conducting path so formed is as follows: point A; filler material 350; plated layer 360; ; filler material 340; plated layer 330; and point B.

Figure 13:
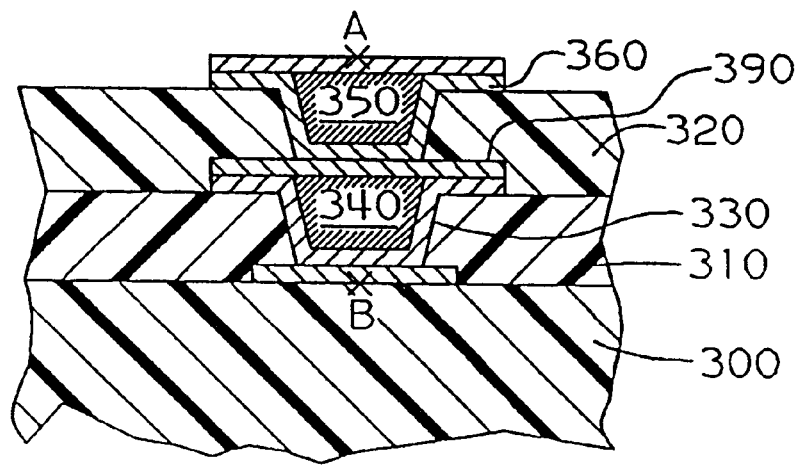

Obviously, a critical teaching of the present invention is that filling and smoothing a formed via hole enables another via hole to be formed directly thereabove. In the broader aspects, the filler may not necessarily be of the same conductive material, as long as it is capable of filling the respective via hole. Consequently, metal paste, a lesser conducting metal than copper, or, equally significant, even a non-conducting insulative resin material can meet the objects of the present invention. FIG. 13 shows a structure when using an insulating material, such as resin, or a poorly conductive material, such as metal paste, as the filler material. This structure is in principle the same as the one shown in FIG. 12 when using a metal as filler, but differs only in that a conductive material layer 390 is formed between the plated layer 330 formed on the first via hole 340 and the filled second via hole 350. This conductive, e.g., copper layer 390 forms a good conducting path between points A and B. The conducting path in this structure, assuming a poor conductive material or even a non-conductive material is used as the filler material, is as follows: point A; plated layer 360; conductive layer 390; plated layer 330; point B.

Figure 14:
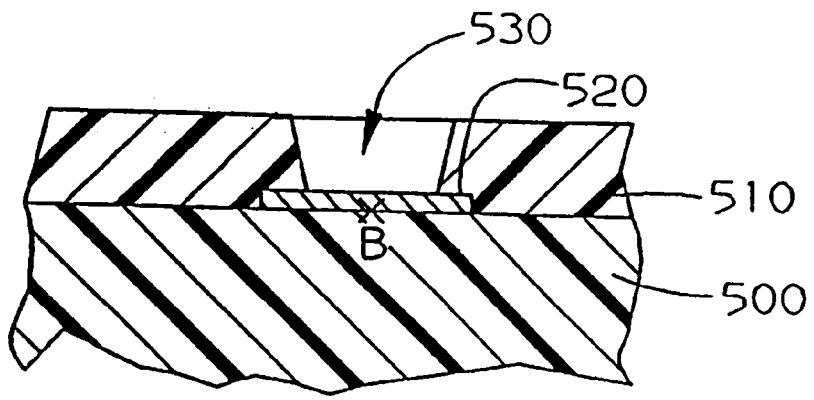
FIGS. 14–19 represent various views of steps which may be used to produce a printed wiring board in accordance with one aspect of this invention.
Figure 15:
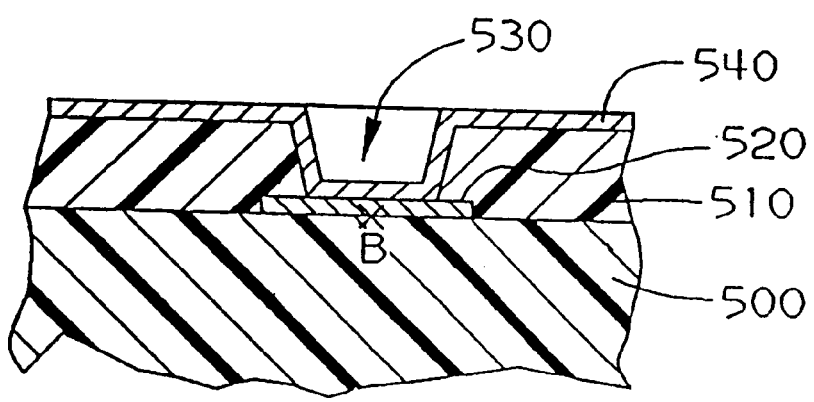
Figure 16:
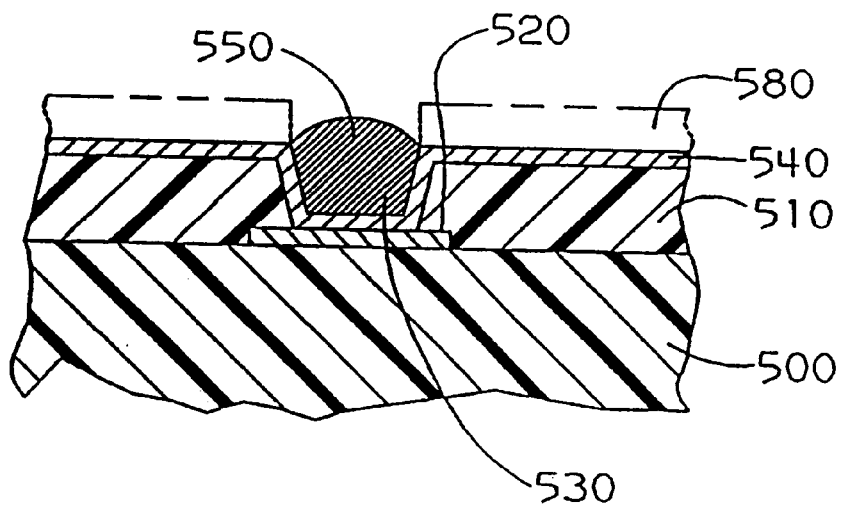
Figure 17:
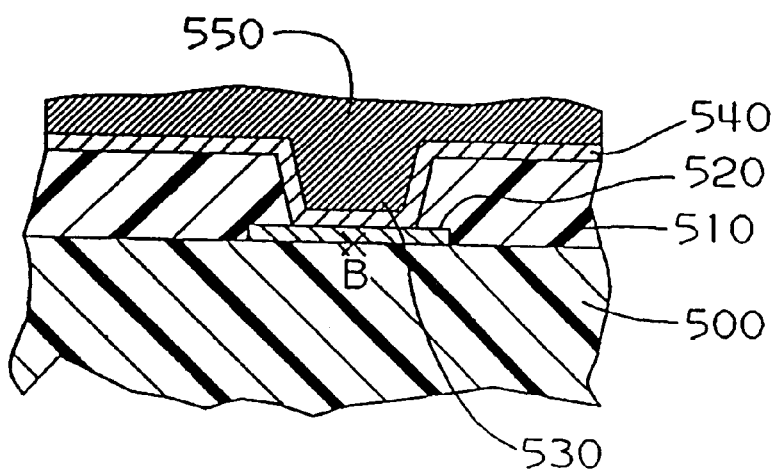
Figure 18:
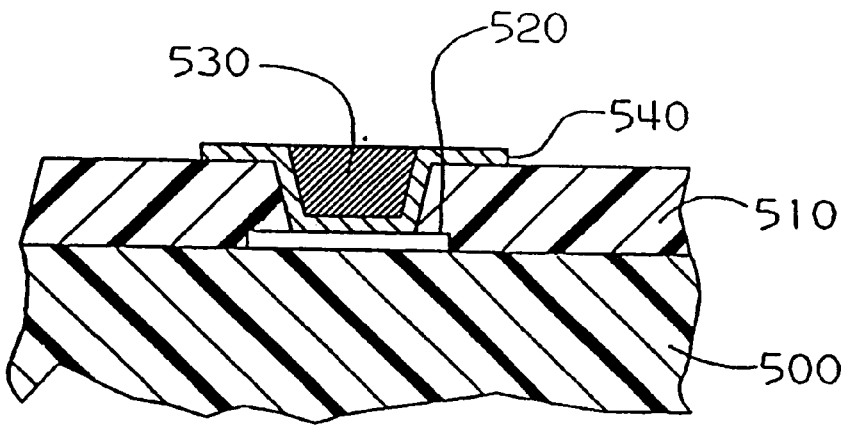
Figure 19:
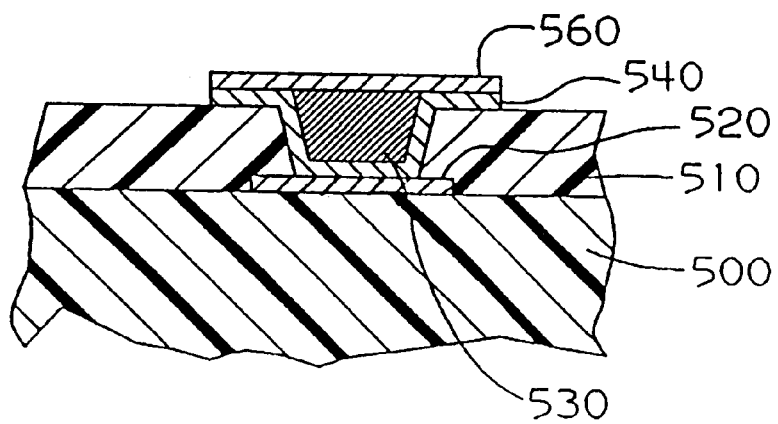

A method for making the above structure will now be described. As shown in FIG. 14, a first via hole 530 is formed by removing part of the first insulating layer 510 located right above the point (B) which is to be connected with the electrode 520 on the lower substrate 500. Forming this via hole can be performed by a known photolithography method which includes applying a photoresist, developing the photoresist, and so on. Then, as shown in FIG. 15, a plated layer 540, e.g., of copper or other metal material, is formed on the first via hole 530. The next process differs depending upon what is selected as the filler material. When using metal as the filler, the outer portions (other than the via hole) are covered with a photoresist 580 so that a metal-plated layer 540 may then be formed in the via hole, e.g., using a known plating process. The photoresist is then removed. In comparison, when using a paste-like material as the filler (including a non-conductor such as a resin), the paste 550 is spread onto the upper surface (e.g. using a squeegee or the like) of layer 540. Paste 550 also fills the via hole 530. Use of excessive filler material 550 assures that the first via hole is completely filled. If the filler material extends over onto such outer surfaces of layer 540, a mechanical process such as surface grinding can be used to smooth the surface. Formation of the desired circuit pattern on the smoothed surface next occurs, this pattern not shown in the drawings but understood to lie adjacent and perhaps connected to, layer 540. Subsequently, a second plated layer 560 is formed on the first plated layer 540 and is shown to cover the filler material in hole 530. Stacking the resulting structure in FIG. 19 in double layers will result in a structure such as shown in FIG. 13. Stacking two structures as shown in FIG. 18 leads to a structure shown in FIG. 12. Thus, a structure of two stacked (vertically above one another) via holes is attained using the invention's teachings. Clearly, additional stacking, resulting in more than two connecting, vertical via holes, is readily attainable.

The defined vertical stacking is accomplished using a minimum of board real estate (in vertical orientation), including connecting two points on a plurality of non-adjacent layers.

Figure 11:
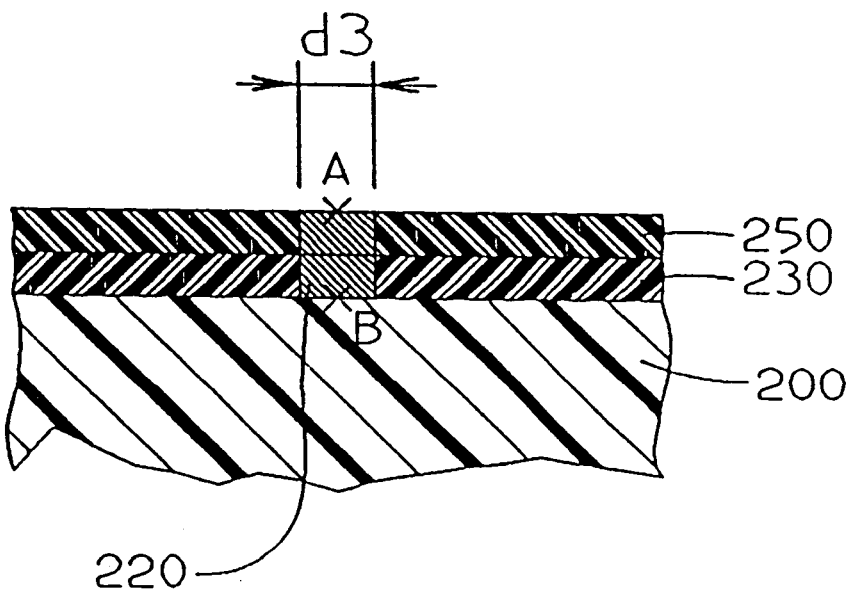

The following represent comparative data for the structures described and shown hereinabove:

|  | $d_1$ (FIG. 5) | $d_2$ (FIG. 6) | $d_3$ (FIG. 11) | $d_4$ (FIG. 12) |
| --- | --- | --- | --- | --- |
| diameter (mm) | 0.25 | 0.45 | 0.15 | 0.12 |
| $d^2$ | 0.0625 | 0.205 | 0.0225 | 0.0144 |
| $(d_n/d_4)^2$ | 4.34 | 14.24 | 1.56 | — |

The structure of the present invention thus represents a considerable savings in consumed board real estate area in comparison to the other structures of the prior art.

The method according to the present invention enables the effective connection of two points on a plurality of non-adjacent layers using a filled via hole and the formation of a second via hole thereabove. The diameter of the second via hole is not larger than necessary, and in fact is approximately the same as that of the underlying via hole(s). Board area consumption is thus minimized, allowing for usage of the unused area for other circuitry and/or electrical components. Also, the reliability of the process described herein is higher than that of the aforedescribed stud method or methods of other background arts such that the yield of resulting products is also increased.

The preferred dielectric materials used herein can be those conventionally used in the current art, e.g., fiberglass-reinforced epoxy resin (also known as "FR4" material), as can be the conductive materials. The materials possible for the fillers used herein have been described above.

While there have been shown and described what are at present considered the preferred embodiments of the invention, it will be obvious to those skilled in the art that various changes and modifications may be made therein without departing from the scope of the invention as defined by the appended claims.

What is claimed:

1. A method for fabricating a multilayered printed wiring board comprising the steps of:

providing a first insulating layer;

forming a first via hole at a predetermined position within said insulating layer;

forming a first metal plated layer on said first via hole, said first metal layer having an outer surface external of said first via hole;

filling said first via hole with filler material;

smoothing said outer surface of said first metal plated layer after said step of filling said first via hole with said filler material;

forming a second insulating layer on said first insulating layer and over said first via hole;

forming a second via hole in said second insulating layer at a location directly above said first via hole in said first insulating layer and in direct contact therewith;

forming a second metal plated layer on said second via hole such that said second metal plated layer is in direct physical contact with said filler material within said first via hole; and forming an electrical circuit pattern from said second metal plated layer.

2. The method of claim 1 further including the step of filling said second via hole with filler material.

3. The method of claim 2 wherein said filling of said second via hole includes filling said second via hole with electrically conductive filler material.

4. The method of claim 1 wherein said filling of said first via hole includes filling said first via hole with electrically conductive filler material.

* * * * *